United States Patent [19]

Thom et al.

[11] Patent Number: 4,674,812
[45] Date of Patent: Jun. 23, 1987

[54] BACKPLANE WIRING FOR ELECTRICAL PRINTED CIRCUIT CARDS

[75] Inventors: Guenter Thom, Gauting; Karl Zell, Niederpoecking, both of Fed. Rep. of Germany

[73] Assignee: Siemens Aktiengesellschaft, Berlin and Munich, Fed. Rep. of Germany

[21] Appl. No.: 827,005

[22] Filed: Feb. 7, 1986

[30] Foreign Application Priority Data

Mar. 28, 1985 [DE] Fed. Rep. of Germany ....... 3511384

[51] Int. Cl.$^4$ ............................................ H01R 23/72
[52] U.S. Cl. ..................................................... 439/78
[58] Field of Search ................ 339/17 R, 17 C, 17 M, 339/17 LM, 17 L, 17 LC, 49 R, 125 R, 126 R, 126 RS, 132 R, 132 B, 176 M, 176 MP, 196 M, 198 R, 198 H, 198 G, 198 P, 198 S

[56] References Cited

U.S. PATENT DOCUMENTS 4,597,626 7/1986 Gabbard et al. ................ 339/17 M

FOREIGN PATENT DOCUMENTS 1023979 3/1966 United Kingdom .......... 339/17 LC

*Primary Examiner*—Neil Abrams
*Attorney, Agent, or Firm*—Hill, Van Santen, Steadman & Simpson

[57] ABSTRACT

A backplane wiring comprising a backplane printed circuit board 1 through which contact pins 2 are inserted and centering strips 3 which can be plugged on the contact pins of the circuit board to allow the acceptance of plugs or clip connectors so as to provide as many plugs as possible for the backplane wiring of the PC cards. The backplane printed circuit board 1 comprises a complete pin field and the centering strips 3 are provided with lateral recesses 4 at their longitudinal walls for accepting adjoining contact pins 2.

4 Claims, 1 Drawing Figure

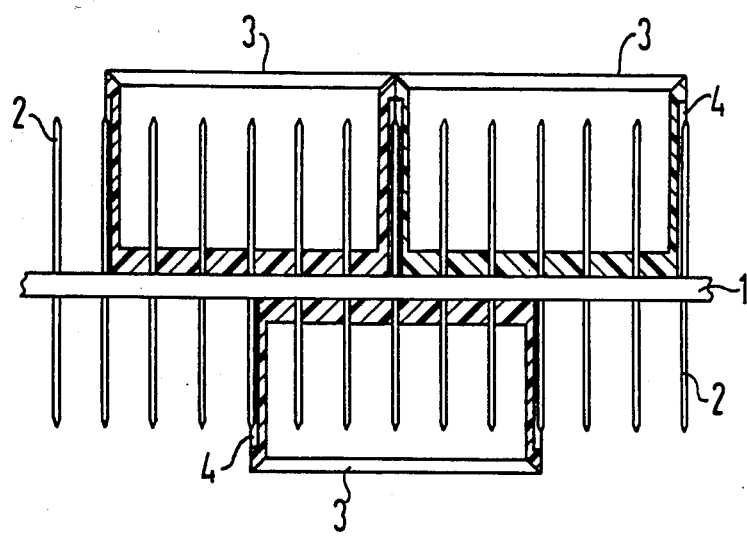

BACKPLANE WIRING FOR ELECTRICAL PRINTED CIRCUIT CARDS

BACKGROUND OF THE INVENTION

1. Field of the Invention

The invention relates in general to a backplane wiring system for electrical printed circuit cards composed of a backplane printed circuit board with inserted contact pins and centering strips formed as a rectangular housing which is opened on side and which can be plugged over the contact pins wherein the open side allows the acceptance of plugs or clip connectors. The centering strips are provided with floors through which the contact pins extend.

2. Description of the Prior Art

Prior art backplane wiring is usually executed such that the printed circuit cards are inserted into the backplane printed circuit board from the front and plugs of a transfer or input system are inserted from the back onto the corresponding contact pins of the backplane printed circuit board. Known backplane wiring systems are constructed such that they are provided with a pin field which is arranged in a grid-like manner only at those locations where the front printed circuit cards are to be mounted. These known backplane wiring arrangements have a number of disadvantages. First, the backplane printed circuit board cannot be completely utilized, second there is a lack of utlization of the space of the backplane printed circuit board with clip connectors or plugs since much space is wasted. Depending upon the intended use of the device, different backplane printed circuit boards must be individually manufactured and stored in applications of the prior art.

SUMMARY OF THE INVENTION

It is an object of the present invention to provide a backplane wiring system which assures a large number of plugs and clip connectors can be connected to each printed circuit card so as to allow as complete as possible exploitation of the area of the backplane printed circuit boards.

For a backplane wiring of the invention, the object is achieved in that the backplane printed circuit board comprises a complete pin field in matrix form or other arrangement and that centering strips which have lateral recesses at their longitudinal walls for accepting adjoining pins are mounted on the backplane printed circuit boards.

In the backplane printed circuit board according to the invention, the backplane printed circuit board is completely filled with pins which are arranged in a grid-like manner and the single grid-like board can be used for all applications without requiring that a number of different boards be provided. Lateral recesses at the longitudinal walls of the centering strips are provided and this results in the possibility of slipping centering strips directly adjoining onto the backplane printed circuit board so that as complete as possible an exploitation of the backplane printed circuit board results. A multitude of design possibilities for slipping on plugs or respectively clipped connectors results from this structure.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

BRIEF DESCRIPTION OF THE DRAWINGS

The drawing comprises a sectional view through a backplane printed circuit board and three centering strips mounted on the board.

DESCRIPTION OF THE PREFERRED EMBODIMENT

The FIGURE illustrates a partial sectional view through a backplane wiring device according to the invention. A backplane printed circuit board 1 is completely covered with contact pins 2 which extend through the board 1 and are arranged in a matrix or grid-like fashion so that they extend across the board in the plane of the paper as illustrated and as well as extending into the plane and out of the plane of the paper relative to the FIGURE so that a matrix of a large number of contact pins 2 are mounted in the backplane printed circuit board 1. A plurality of centering strips 3 which serve for better guidance of plugs or clip connectors during connections can be slipped onto the contact pins of the backplane printed circuit board from both sides. For example, in the FIGURE, three centering strips 3 are illustrated with a first centering strip 3 being received over a number of the pins 2 on the bottom surface of the backplane printed circuit board 1 and two centering strips 3 being received over the pins on the top side of the printed circuit board 1. It is to be realized that the centering strips 3 may be generally rectangular in shape and are provided with aligned openings for receiving the pins 2 as illustrated. Lateral recesses 4 are formed in the outer surfaces of the centering strips 3 on their longitudinal walls and such lateral recesses are formed to align with contact pins 2 which are adjacent the outside side walls of the centering strips 3. The recesses 4 are clearly illustrated in the centering strips 3 illustrated in the FIGURE and it is noted that pins external to the centering strips are received in such recesses. Particularly, it should be noted that between the two centering strips 3 on the upper surface of the backplane printed circuit board 1 in the FIGURE a pin 2 fits in the two recesses 4 of the two upper centering strips 3. Thus, the lateral recesses 4 in the longitudinal walls of the centering strips 3 make it possible to plug the centering strips into the contact pins such that even with a complete pin field that the centering strips will be tightly mounted adjacent each other. In this manner, the full backplane wiring can be utilized as completely as possible.

Since the backplane printed circuit board is fully occupied with contact pins, it is possible to overplug the printed circuit cards or, respectively, allow plugs which lie opposite each other as illustrated in the FIGURE to be connected. Thus, for example, one plug or, respectively, one printed circuit card could be connected to two separate printed circuit cards or plugs.

With the backplane wiring of the invention, thus plugs of a transfer or input system could be mounted at the most favorable locations for carrying signals away regardless of the plug-in locations of the electrical printed circuit cards. The backplane wiring also enables simultaneous tapping by a plug of the printed circuit card and a backplane wiring which later may be present.

Although the invention has been described with respect to preferred embodiments, it is not to be so limited as changes and modifications can be made which are within the full intended scope of the invention as defined by the appended claims.

We claim as our invention:

1. A backplane wiring arrangement for electrical printed circuit cards comprising, a backplane printed circuit board with contact pins inserted therein and centering strips pluggable thereupon, said centering strips formed with a rectangular housing with four outer walls which is open at one side for the receiving plugs or clip connectors which are rigidly connected to electrical printed circuit cards, whereby said centering strips have a floor with openings through which said contact pins extend, characterized in that said backplane printed circuit board (1) has a full field of contact pins and said centering strips (3) are formed with lateral recesses (4) in said outer walls for receiving certain ones of said contact pins (2), and wherein said lateral recesses have depths equal to one half the width of said contact pins so that two adjacent centering strips can be mounted in contact with each other.

2. A backplane wiring arrangement for electrical printed circuit cards comprising a planar backplane printed circuit board, a plurality of contact pins extending from either side through said backplane printed circuit board and substantially covering said backplane printed circuit board, and a plurality of centering connector strips of generally rectangular shape and formed with a floor portion with mating openings for receiving said contact pins and four wall portions extending outwardly from said floor portion so as to form a socket into which an electrical plug can be received and recesses formed in said four wall portions on their outer surfaces so as to receive certain ones of said contact pins therein and said recesses formed in said four wall portions on the outer surfaces having depths of one half the width of said contact pins so that two adjacent centering connector strips can be mounted in contact with each other.

3. A backplane wiring arrangement according to claim 2 wherein said contact pins are arranged in a matrix pattern.

4. A backplane wiring arrangement according to claim 2 wherein said floor portion and said centering connector strips are generally rectangularly shaped.

* * * * *